(12) United States Patent
Frey

(10) Patent No.: US 10,941,168 B2
(45) Date of Patent: Mar. 9, 2021

(54) PHOSPHEPINE MATRIX COMPOUND FOR A SEMICONDUCTING MATERIAL

(71) Applicant: Novaled GmbH, Dresden (DE)

(72) Inventor: Julien Frey, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 16/311,796

(22) PCT Filed: Jun. 21, 2017

(86) PCT No.: PCT/EP2017/065251
§ 371 (c)(1),
(2) Date: Dec. 20, 2018

(87) PCT Pub. No.: WO2017/220660
PCT Pub. Date: Dec. 28, 2017

(65) Prior Publication Data
US 2019/0202848 A1    Jul. 4, 2019

(30) Foreign Application Priority Data

Jun. 22, 2016 (DE) .......................... 102016111436.7

(51) Int. Cl.
| | | |
|---|---|---|
| *C07F 9/6568* | (2006.01) |
| *C07F 5/02* | (2006.01) |
| *H05B 33/14* | (2006.01) |
| *H01L 51/00* | (2006.01) |
| *H01L 51/50* | (2006.01) |

(52) U.S. Cl.
CPC ............ *C07F 9/65685* (2013.01); *C07F 5/02* (2013.01); *H01L 51/005* (2013.01); *H01L 51/0071* (2013.01); *H05B 33/14* (2013.01); *H01L 51/5076* (2013.01)

(58) Field of Classification Search
CPC ........................................................ C07F 5/02
USPC ......................................................... 568/12
See application file for complete search history.

(56) References Cited

FOREIGN PATENT DOCUMENTS

| WO | 2015/097225 A1 | 7/2015 |
| WO | 2016/207224 A1 | 12/2016 |
| WO | 2016/207229 A1 | 12/2016 |

OTHER PUBLICATIONS

Makaya et al. Phosphorus, Sulfur and Silicon and the Related Elements (2015), 190(5-6), 789-802 (abstract).*
PCT International Search Report and Written Opinion for PCT Application No. PCT/EP2017/065251 dated Sep. 7, 2017 (13 pages).

* cited by examiner

*Primary Examiner* — Ana Z Muresan
(74) *Attorney, Agent, or Firm* — Eversheds Sutherland (US) LLP

(57) ABSTRACT

The present invention relates to a compound comprising at least one phosphepine ring and having the phosphorus atom of the phosphepine ring substituted with at least one monovalent substituent R, a semiconducting material comprising the compound, and electronic device comprising the semiconducting material.

13 Claims, 1 Drawing Sheet

Figures

PHOSPHEPINE MATRIX COMPOUND FOR A SEMICONDUCTING MATERIAL

CROSS REFERENCE TO RELATED APPLICATIONS

This application is a U.S. national stage application of PCT/EP2017/065251, filed Jun. 21, 2017, which claims priority to German Application No. 102016111436.7, filed Jun. 22, 2016. The content of these applications is incorporated herein by reference.

The present invention concerns new organic compounds comprising a phosphepine ring and their use as and/or in semiconducting materials, semiconducting materials with improved electrical properties that comprise the new phosphepine matrix compound and electronic devices utilizing the new phosphepine compound and/or improved electrical properties of the inventive semiconducting material.

BACKGROUND OF THE INVENTION

Among the electronic devices comprising at least a part based on material provided by organic chemistry, organic light emitting diodes (OLEDs) have a prominent position. Since the demonstration of efficient OLEDs by Tang et al. in 1987 (C. W. Tang et al., Appl. Phys. Lett. 51 (12), 913 (1987)), OLEDs developed from promising candidates to high-end commercial displays. An OLED comprises a sequence of thin layers substantially made of organic materials. The layers typically have a thickness in the range of 1 nm to 5 μm. The layers are usually formed either by means of vacuum deposition or from a solution, for example by means of spin coating or jet printing.

OLEDs emit light after the injection of charge carriers in the form of electrons from the cathode and in form of holes from the anode into organic layers arranged in between. The charge carrier injection is effected on the basis of an applied external voltage, the subsequent formation of excitons in a light emitting zone and the radiative recombination of those excitons. At least one of the electrodes is transparent or semitransparent, in the majority of cases in the form of a transparent oxide, such as indium tin oxide (ITO), or a thin metal layer.

Use of phosphepine compounds in organic semiconducting materials was disclosed by the applicants in documents WO2015/097225 and WO2015/097232.

It is an objective of the invention to further explore the new field of phosphepine-based semiconducting materials and find new subclasses thereof which may become particularly appropriate for specific uses in organic electronic devices. Specifically, the sought compounds shall be successfully embedded in electrically doped semiconducting materials for use in electronic devices. By exploiting the versatility of phosphepine compounds, the inventive semiconducting materials shall further expand particularly the scope of electron transport materials which may enable the design of high-performance OLEDs by combination of inventive materials with known auxiliary materials used in other OLED layers.

SUMMARY OF THE INVENTION

The object is achieved by a compound comprising at least one phosphepine ring and having the phosphorus atom of the phosphepine ring substituted with at least one monovalent substituent R, wherein a) the phosphepine ring is a ring according to formula (I)

b) structural moieties A, B, C are independently selected from
(i) unsubstituted ortho-phenylene,
(ii) ortho-phenylene substituted with up to four substituents independently selected from alkyl, heteroalkyl, alkoxy, alkylthio, phenoxy, phenylthio, diphenylphosphinyl, diphenylphosphoryl and from disubstituted amino group wherein the substituents on the nitrogen atom of the amino group are independently selected from phenyl and alkyl, and
(iii) five-membered ring ortho-heteroarylene selected from thienylene, furylene, pyrrolylene, diazolylene, triazolylene, oxazolylene, thiazolylene, oxadiazolylene and thiadiazolylene, wherein each ortho-heteroarylene independently may be unsubstituted or substituted with one or more substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
c) R is selected from
(i) unsubstituted phenyl and phenyl substituted with up to five substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl,
(ii) H, alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
(iii) five-membered ring heteroaryl selected from thienyl, furyl, pyrrolyl, diazolyl, triazolyl, oxazolyl, thiazolyl, oxadiazolyl and thiadiazolyl, wherein the heteroaryl may be unsubstituted or substituted with one or more substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl.

Preferably,
(i) R is the substituted phenyl or the heteroaryl and any substituent on the phenyl or the heteroaryl comprises up to 30 carbon atoms, preferably up to 20 carbon atoms, more preferably up to 10 carbon atoms, even more preferably up to 8 carbon atoms, most preferably up to 6 carbon atoms and/or
(ii) any alkyl, heteroalkyl, alkoxy, alkylthio, phenoxy, phenylthio comprises up to 30 carbon atoms, preferably up to 20 carbon atoms, more preferably up to 10 carbon atoms, even more preferably up to 8 carbon atoms, most preferably up to 6 carbon atoms.

In one embodiment, the compound comprising at least one phosphepine ring comprises at least one tetravalent or pentavalent phosphorus atom.

Also preferably, the compound comprising at least one phosphepine ring comprises at least one phosphine oxide group.

More preferably, the phosphepine ring is a phosphepine-P-oxide ring. Also preferably, the compound comprising at least one phosphepine ring has formula (II)

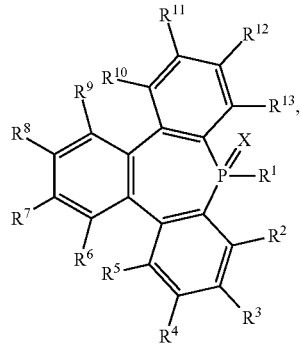

wherein
a) $R^1$ is selected from
  (i) unsubstituted phenyl and phenyl substituted with up to five substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl,
  (ii) H, alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
  (iii) five-membered ring heteroaryl selected from thienyl, furyl, pyrrolyl, diazolyl, triazolyl, oxazolyl, thiazolyl, oxadiazolyl and thiadiazolyl, wherein the heteroaryl may be unsubstituted or substituted with one or more substituents independently selected from alkyl, heteroalkyl, alkoxy, alkylthio, phenoxy, phenylthio, diphenylphosphinyl, and from disubstituted amino group, wherein the substituents on the nitrogen atom of the amino group are independently selected from phenyl and alkyl,
b) $R^2$-$R^{13}$ are independently selected from H, alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
c) X is selected from O and S.

In one embodiment, $R^1$ is phenyl and/or any of $R^2$-$R^{13}$ is H.

In one embodiment, the compound comprising at least one phosphepine ring is used as a charge transporting matrix.

The object is further achieved by a semiconducting material comprising at least one matrix compound, wherein the matrix compound comprises at least one phosphepine ring having the phosphorus atom of the phosphepine ring substituted with at least one monovalent substituent R, wherein a) the phosphepine ring is a ring according to formula (I)

b) structural moieties A, B, C are independently selected from
  (i) unsubstituted ortho-phenylene,
  (ii) ortho-phenylene substituted with up to four substituents independently selected from alkyl, heteroalkyl, alkoxy, alkylthio, phenoxy, phenylthio, diphenylphosphinyl, diphenylphosphoryl and from disubstituted amino group wherein the substituents on the nitrogen atom of the amino group are independently selected from phenyl and alkyl, and
  (iii) five-membered ring ortho-heteroarylene selected from thienylene, furylene, pyrrolylene, diazolylene, triazolylene, oxazolylene, thiazolylene, oxadiazolylene and thiadiazolylene, wherein each ortho-heteroarylene independently may be unsubstituted or substituted with one or more substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
c) R is selected from
  (i) unsubstituted phenyl and phenyl substituted with up to five substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl,
  (ii) H, alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
  (iii) five-membered ring heteroaryl selected from thienyl, furyl, pyrrolyl, diazolyl, triazolyl, oxazolyl, thiazolyl, oxadiazolyl and thiadiazolyl, wherein the heteroaryl may be unsubstituted or substituted with one or more substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl.

Optionally, the semiconducting material further comprises at least one dopant. In one of preferred embodiments, the dopant is an electrical dopant. More preferably, the electrical dopant is a n-dopant. Even more preferably, the n-dopant is a metal, a metal salt or a metal complex.

In one embodiment of the inventive semiconducting material, the compound comprising the phosphepine ring comprises at least one tetravalent or pentavalent phosphorus atom. Preferably, the compound comprising the phosphepine ring comprises at least one phosphine oxide group. Also preferably, the phosphepine ring is a phosphepine-P-oxide ring. Preferably,
  (i) R is the substituted phenyl or the heteroaryl and any substituent on the phenyl or the heteroaryl comprises up to 30 carbon atoms, preferably up to 20 carbon atoms, more preferably up to 10 carbon atoms, even more preferably up to 8 carbon atoms, most preferably up to 6 carbon atoms and/or (ii) any alkyl, heteroalkyl, alkoxy, alkylthio, phenoxy, phenylthio comprises up to 30 carbon atoms, preferably up to 20 carbon atoms, more preferably up to 10 carbon atoms, even more preferably up to 8 carbon atoms, most preferably up to 6 carbon atoms.

Also preferably, the compound comprising at least one phosphepine ring has formula (II)

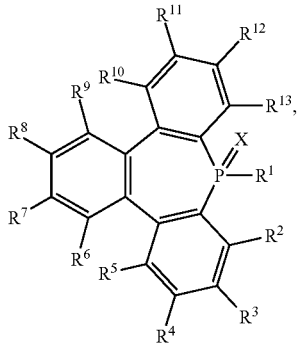

(II)

wherein
a) $R^1$ is selected from
  (i) unsubstituted phenyl and phenyl substituted with up to five substituents independently selected from alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl,
  (ii) H, alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
  (iii) five-membered ring heteroaryl selected from thienyl, furyl, pyrrolyl, diazolyl, triazolyl, oxazolyl, thiazolyl, oxadiazolyl and thiadiazolyl, wherein the heteroaryl may be unsubstituted or substituted with one or more substituents independently selected from alkyl, heteroalkyl, alkoxy, alkylthio, phenoxy, phenylthio, diphenylphosphinyl, and from disubstituted amino group, wherein the substituents on the nitrogen atom of the amino group are independently selected from phenyl and alkyl,
b) $R^2$-$R^{13}$ are independently selected from H, alkyl, heteroalkyl, alkoxy, alkylthio, phenoxy, phenylthio, diphenylphosphinyl, diphenylphosphoryl and from disubstituted amino group, wherein the substituents on the nitrogen atom of the amino group are independently selected from phenyl and alkyl, and
c) X is selected from O and S.

Preferably, the semiconducting material comprising the inventive phosphepine matrix compound serves as an electron transporting material or as an electron injecting material, or fulfils both electron transporting and hole blocking function.

It is preferred that the semiconducting material according to the invention comprises the dopant and the phosphepine matrix compound at least partly in form of a homogeneous mixture, wherein both components are molecularly dispersed in each other.

Another object the invention is achieved by an electronic device comprising, preferably between two electrodes, at least one semiconducting material comprising the new phosphepine matrix compound as described above. Preferably, the inventive semiconducting material comprising the phosphepine matrix compound forms at least one layer between a cathode and an anode.

Specifically, the object of the invention is represented by an electronic device comprising at least one semiconducting layer comprising the doped semiconducting material according to the invention or consisting of it. More specifically, the semiconducting material according to the invention is used in the electronic device as an electron transporting layer, as an electron injecting layer, or as a layer having double electron transporting and hole blocking function.

Preferred examples of the electronic device comprising the semiconducting material according to the invention are organic diodes and organic transistors. More preferably, the electronic device is a light emitting device. Most preferably, the light emitting device is an organic light emitting diode.

DETAILED DESCRIPTION OF THE INVENTION

Device Architecture

Figure 1:
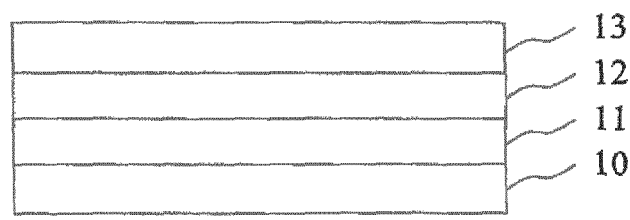
FIG. 1 shows a schematic illustration of a device in which the present invention can be incorporated.

FIG. 1 shows a stack of anode (10), organic semiconducting layer (11) comprising the light emitting layer, electron transporting layer (ETL) (12), and cathode (13). Other layers can be inserted between those depicted, as explained herein.

Figure 2:
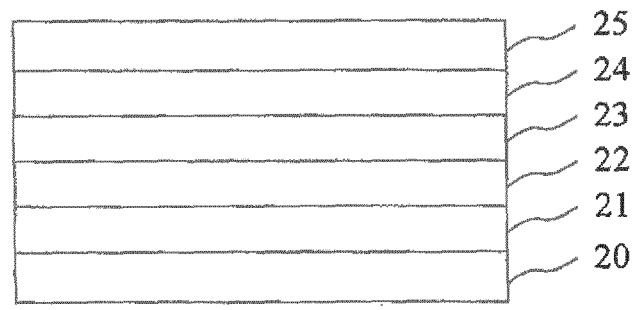
FIG. 2 shows a schematic illustration of a device in which the present invention can be incorporated.

FIG. 2 shows a stack of an anode (20), a hole injecting and transporting layer (21), a hole transporting layer (22) which can also aggregate the function of electron blocking, a light emitting layer (23), an ETL (24), and a cathode (25). Other layers can be inserted between those depicted, as explained herein.

The wording "device" comprises the organic light emitting diode.

Material Properties—Energy Levels

A method to determine the ionization potentials (IP) is the ultraviolet photo spectroscopy (UPS). It is usual to measure the ionization potential for solid state materials; however, it is also possible to measure the IP in the gas phase. Both values are differentiated by their solid state effects, which are, for example the polarization energy of the holes that are created during the photo ionization process. A typical value for the polarization energy is approximately 1 eV, but larger discrepancies of the values can also occur. The IP is related to beginning of the photoemission spectra in the region of the large kinetic energy of the photoelectrons, i.e. the energy of the most weakly bounded electrons. A related method to UPS, the inverted photo electron spectroscopy (IPES) can be used to determine the electron affinity (EA). However, this method is less common. Electrochemical measurements in solution are an alternative to the determination of solid state oxidation ($E_{ox}$) and reduction ($E_{red}$) potential. An adequate method is for example the cyclo-voltammetry. A simple rule is used very often for the conversion of red/ox potentials into electron affinities and ionization potential: IP=4.8 eV+e*$E_{ox}$ (vs. ferrocenium/ferrocene (Fc$^+$/Fc)) and EA=4.8 eV+e*$E_{red}$ (vs. Fc$^+$/Fc) respectively (see B. W. D'Andrade, Org. Electron. 6, 11-20 (2005)). Processes are known for the correction of the electrochemical potentials in the case other reference electrodes or other redox pairs are used (see A J. Bard, L. R. Faulkner, "Electrochemical Methods: Fundamentals and Applications", Wiley, 2. Ausgabe 2000). The information about the influence of the solution used can be found in N. G. Connelly et al., Chem. Rev. 96, 877 (1996). It is usual, even if not exactly correct to use the terms, "energy of the HOMO" $E_{(HOMO)}$ and "energy of the LUMO" $E_{(LUMO)}$ respectively as synonyms for the ionization energy and electron affinity (Koopmans theorem). It has to be taken in consideration, that the ionization potentials and the electron affinities are given in such a way that a larger value represents a stronger binding of a released or respectively of an absorbed electron. The energy scale of the frontier molecular orbitals (HOMO, LUMO) is opposed to this. Therefore, in a rough approximation, is valid: IP=−$E_{(HOMO)}$ and EA=$E_{(LUMO)}$. The given potentials correspond to the solid-state potentials.

Substrate

It can be flexible or rigid, transparent, opaque, reflective, or translucent. The substrate should be transparent or translucent if the light generated by the OLED is to be transmitted through the substrate (bottom emitting). The substrate may be opaque if the light generated by the OLED is to be emitted in the direction opposite of the substrate, the so called top-emitting type. The OLED can also be transparent. The substrate can be either arranged adjacent to the cathode or anode.

Electrodes

The electrodes are the anode and the cathode, they must provide a certain amount of conductivity, being preferentially conductors. Preferentially the "first electrode" is the cathode. At least one of the electrodes must be semi-transparent or transparent to enable the light transmission to the outside of the device. Typical electrodes are layers or a stack of layer, comprising metal and/or transparent conductive oxide. Other possible electrodes are made of thin busbars (e.g. a thin metal grid) wherein the spaces between the busbars is filled (coated) with a transparent material with a certain conductivity, such as graphene, carbon nanotubes, doped organic semiconductors, etc.

In one mode, the anode is the electrode closest to the substrate, which is called non-inverted structure. In another mode, the cathode is the electrode closest to the substrate, which is called inverted structure.

Typical materials for the Anode are ITO and Ag. Typical materials for the cathode are Mg:Ag (10 vol. % of Mg), Ag, ITO, Al. Mixtures and multilayer are also possible.

Preferably, the cathode comprises a metal selected from Ag, Al, Mg, Ba, Ca, Yb, In, Zn, Sn, Sm, Bi, Eu, Li, more preferably from Al, Mg, Ca, Ba and even more preferably selected from Al or Mg. Preferred is also a cathode comprising an alloy of Mg and Ag.

Hole-Transporting Layer (HTL)

Is a layer comprising a large gap semiconductor responsible to transport holes from the anode or holes from a CGL to the light emitting layer (LEL). The HTL is comprised between the anode and the LEL or between the hole generating side of a CGL and the LEL. The HTL can be mixed with another material, for example a p-dopant, in which case it is said the HTL is p-doped. The HTL can be comprised by several layers, which can have different compositions. P-doping the HTL lowers its resistivity and avoids the respective power loss due to the otherwise high resistivity of the undoped semiconductor. The doped HTL can also be used as optical spacer, because it can be made very thick, up to 1000 nm or more without significant increase in resistivity.

Suitable hole transport materials (HTM) can be, for instance HTM from the diamine class, where a conjugated system is provided at least between the two diamine nitrogens. Examples are N4,N4'-di(naphthalen-1-yl)-N4,N4'-diphenyl-[1,1'-biphenyl]-4,4'-diamine (HTM1), N4,N4,N4", N4"-tetra([1,1'-biphenyl]-4-yl)-[1,1':4',1"-terphenyl]-4,4"-diamine (HTM2). The synthesis of diamines is well described in literature; many diamine HTMs are readily commercially available.

Hole-Injecting Layer (HIL)

Is a layer which facilitates the injection of holes from the anode or from the hole generating side of a CGL into an adjacent HTL. Typically the HIL is a very thin layer (<10 nm). The hole injection layer can be a pure layer of p-dopant and can be about 1 nm thick. When the HTL is doped, an HIL may not be necessary, since the injection function is already provided by the HTL.

Light-Emitting Layer (LEL)

The light emitting layer must comprise at least one emission material and can optionally comprise additional layers. If the LEL comprises a mixture of two or more materials the charge carrier injection can occur in different materials for instance in a material which is not the emitter, or the charge carrier injection can also occur directly into the emitter. Many different energy transfer processes can occur inside the LEL or adjacent LELs leading to different types of emission. For instance excitons can be formed in a host material and then be transferred as singlet or triplet excitons to an emitter material which can be singlet or triplet emitter which then emits light. A mixture of different types of emitter can be provided for higher efficiency. Mixed light can be realized by using emission from an emitter host and an emitter dopant.

Blocking layers can be used to improve the confinement of charge carriers in the LEL, these blocking layers are further explained in U.S. Pat. No. 7,074,500 B2.

Electron-Transporting Layer (ETL)

Is a layer comprising a large gap semiconductor responsible to transport electrons from the cathode or electrons from a CGL or EIL (see below) to the light emitting layer (LEL). The ETL is comprised between the cathode and the LEL or between the electron generating side of a CGL and the LEL. The ETL can be mixed with an electrical n-dopant, in which case it is said the ETL is n-doped. The ETL can be comprised by several layers, which can have different compositions. Electrical n-doping the ETL lowers its resistivity and/or improves its ability to inject electrons into an adjacent layer and avoids the respective power loss due to the otherwise high resistivity (and/or bad injection ability) of the undoped semiconductor. The doped ETL can also be used as optical spacer, because it can be made very thick, up to 1000 nm or more without significant increase in resistivity.

The present invention may exploit an inventive phosphepine compound, preferably a compound according to formula (Ia) or (Ib) in the ETL. The inventive phosphepine compound can be used in combination with other materials, in the whole layer or in a sub-layer of the ETL.

Hole blocking layers and electron blocking layers can be employed as usual.

Other layers with different functions can be included, and the device architecture can be adapted as known by the skilled in the art. For example, an Electron-Injecting Layer (EIL) can be used between the cathode and the ETL. Also the EIL can comprise the inventive matrix compounds of the present application.

Charge Generation Layer (CGL)

The OLED can comprise a CGL which can be used in conjunction with an electrode as inversion contact, or as connecting unit in stacked OLEDs. A CGL can have the most different configurations and names, examples are pn-junction, connecting unit, tunnel junction, etc. Best examples are pn junctions as disclosed in US 2009/0045728 A1, US 2010/0288362 A1. Metal layers and or insulating layers can also be used.

Stacked OLEDs

When the OLED comprises two or more LELs separated by CGLs, the OLED is named a stacked OLED, otherwise it is named a single unit OLED. The group of layers between two closest CGLs or between one of the electrodes and the closest CGL is named a electroluminescent unit (ELU). Therefore a stacked OLED can be described as anode/ELU$_1$/{CGL$_X$/ELU$_{1+X}$}$_X$/cathode, wherein x is a positive integer and each CGL$_X$ or each ELU$_{1+X}$ can be equal or different. The CGL can also be formed by the adjacent layers of two ELUs as disclosed in US2009/0009072 A1. Further stacked OLEDs are explained e.g. in US 2009/0045728 A1, US 2010/0288362 A1, and references therein.

Deposition of Organic Layers

Any organic semiconducting layers of the inventive display can be deposited by known techniques, such as vacuum thermal evaporation (VTE), organic vapour phase deposition, laser induced thermal transfer, spin coating, blade coating, slot dye coating, inkjet printing, etc. A preferred method for preparing the OLED according to the invention is vacuum thermal evaporation.

Preferably, the ETL is formed by evaporation. When using an additional material in the ETL, it is preferred that the ETL is formed by co-evaporation of the electron transporting matrix (ETM) and the additional material. The additional material may be mixed homogeneously in the ETL. In one mode of the invention, the additional material has a concentration variation in the ETL, wherein the concentration changes in the direction of the thickness of the stack of layers. It is also foreseen that the ETL is structured in sub-layers, wherein some but not all of these sub-layers comprise the additional material.

Electrical Doping

The present invention can be used in addition or in combination with electrical doping of organic semiconducting layers.

The most reliable and at the same time efficient OLEDs are OLEDs comprising electrically doped layers. Generally, the electrical doping means improving of electrical properties, especially the conductivity and/or injection ability of a doped layer in comparison with neat charge-transporting matrix without a dopant. In the narrower sense, which is usually called redox doping or charge transfer doping, hole transport layers are doped with a suitable acceptor material (p-doping) or electron transport layers with a donor material (n-doping), respectively. Through redox doping, the density of charge carriers in organic solids (and therefore the conductivity) can be increased substantially. In other words, the redox doping increases the density of charge carriers of a semiconducting matrix in comparison with the charge carrier density of the undoped matrix. The use of doped charge-carrier transport layers (p-doping of the hole transport layer by admixture of acceptor-like molecules, n-doping of the electron transport layer by admixture of donor-like molecules) in organic light-emitting diodes is, e.g., described in US 2008/203406 and U.S. Pat. No. 5,093,698.

US2008227979 discloses in detail the charge-transfer doping of organic transport materials, with inorganic and with organic dopants. Basically, an effective electron transfer occurs from the dopant to the matrix increasing the Fermi level of the matrix. For an efficient transfer in a p-doping case, the LUMO energy level of the dopant is preferably more negative than the HOMO energy level of the matrix or at least slightly more positive, not more than 0.5 eV, to the HOMO energy level of the matrix. For the n-doping case, the HOMO energy level of the dopant is preferably more positive than the LUMO energy level of the matrix or at least slightly more negative, not lower than 0.5 eV, to the LUMO energy level of the matrix. It is further more desired that the energy level difference for energy transfer from dopant to matrix is smaller than +0.3 eV.

Typical examples of known redox doped hole transport materials are: copperphthalocyanine (CuPc), which HOMO level is approximately −5.2 eV, doped with tetrafluoro-tetracyanoquinonedimethane (F4TCNQ), which LUMO level is about −5.2 eV; zincphthalocyanine (ZnPc) (HOMO=−5.2 eV) doped with F4TCNQ; a-NPD (N,N'-Bis (naphthalen-1-yl)-N,N'-bis(phenyl)-benzidine) doped with F4TCNQ. a-NPD doped with 2,2'-(perfluoronaphthalene-2,6-diylidene) dimalononitrile (PD1). a-NPD doped with 2,2',2"-(cyclopropane-1,2,3-triylidene)tris(2-(p-cyanotetrafluo-rophenyl)acetonitrile) (PD2). All p-doping in the device examples of the present application was done with 8 wt. % of PD2.

Typical examples of known redox doped electron transport materials are: fullerene C60 doped with acridine orange base (AOB); perylene-3,4,9,10-tetracarboxylic-3,4,9,10-dianhydride (PTCDA) doped with leuco crystal violet; 2,9-di (phenanthren-9-yl)-4,7-diphenyl-1,10-phenanthroline doped with tetrakis (1,3,4,6,7,8-hexahydro-2H-pyrimido[1,2-a] pyrimidinato) ditungsten(II) (W$_2$(hpp)$_4$); naphthalene tetracarboxylic acid di-anhydride (NTCDA) doped with 3,6-bis-(dimethyl amino)-acridine; NTCDA doped with bis (ethylene-dithio) tetrathiafulvalene (BEDT-TTF).

Specific examples of metal and metal salt electrical doping in semiconducting materials based on phosphepine matrix compounds were previously disclosed by the applicants in documents WO2015/097225 and WO2015/097232; these documents are herein incorporated by the reference.

Phosphepine Matrix Compound

Based on previously disclosed results achieved with compound E1, the applicants originally supposed that the presence of extended systems of conjugated electrons in the matrix molecule is favourable for performance of phosphepine compounds as matrices in organic semiconducting materials and electronic devices utilizing such semiconducting materials.

Modern quantum chemical methods allow a reliable estimation of relative LUMO energies for different molecules. The computed relative values can be recalculated to absolute scale corresponding to the electrochemical potentials measured in a concrete CV experimental setting, if the calculated value is compared with the value measured for the same compound and the obtained difference is taken into account as a correction for the values calculated for other compounds.

It was found that the LUMO level of the inventive phosphepine matrix compounds, measured as a redox potential by cyclic voltammetry (CV) in tetrahydrofuran (THF) against ferrocenium/ferrocene redox couple as a reference, is significantly higher than the LUMO level of the phosphepine matrix compound E1

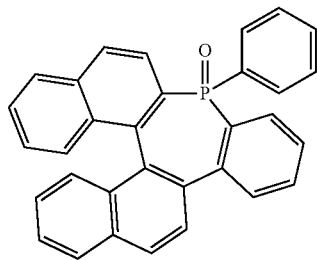

described in WO2015/097225 as a well-performing matrix for organic semiconducting materials.

The present invention surprisingly showed that in phosphepine compounds, their performance in semiconducting materials depends only weakly on the extent of the delocalized system of conjugated electrons in the matrix molecule. Furthermore, it was surprisingly found that the inventive compounds enable effective electrical doping with metals, metal salts or metal complexes, and that the doped electron transport materials based on inventive compounds provide high-performance OLEDs, despite LUMO levels of the inventive compounds are exceptionally high in comparison with state of art matrices currently used in electron transport materials.

Accessibility of Inventive Compounds

Inventive Compound E2

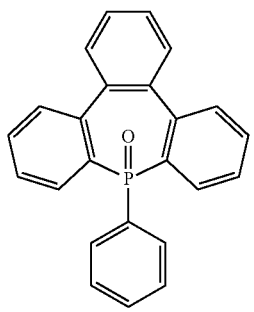

was prepared by analogous procedure as E1.

Still another option for synthesis of inventive compounds is a condensation of dimetallaterphenyl precursors with arylphosphonous dichlorides, analogously to procedure described in Science of Synthesis 17 (2004), pages 916-917. The dimetallaterphenyl precursors are accessible by method described by Wittig et al, Chemische Berichte (1962), 95, 431-42.

Advantageous Effect of the Invention

The favourable effects of the electron-transporting matrix compounds in organic semiconducting materials are shown in comparison with comparative devices comprising instead of the phosphepine compound electron transporting matrices which lack the phosphepine group. Comparative compounds C1-C4 characterized in more detail in the examples are referred to.

Table 1 shows the performance of comparative compound E1 and inventive compound E2 in model OLED devices, described in detail in example 1, with respect to voltage (U) and quantum efficiency (Qeff). Additionally, the values of the CIE 1931 coordinate y are given as a measure of similar spectral distribution of luminance in the compared devices. Values of the average time necessary for the 3% change in the initial luminance (LT97) at the room temperature were not yet available at the date of filing. The LUMO energy level of both compounds is expressed in terms of redox potential estimated by cyclic voltammetry by standard procedure using tetrahydrofuran as a solvent and ferrocene/ferrocenium as reference redox couple.

TABLE 1

| Code | LUMO (V) | Yb doped | | | | | D1 doped | | | | |
| --- | --- | --- | --- | --- | --- | --- | --- | --- | --- | --- | --- |
| | | U (V) | Qeff | Q/U | CIEy | LT97 (h) | U (V) | Qeff | Q/U | CIEy | LT97 (h) |
| E1 | −2.62 | 3.5 | 5.8 | 1.66 | 0.098 | na | 3.4 | 5.4 | 1.59 | 0.098 | na |
| E2 | −2.91 | 3.4 | 5.5 | 1.62 | 0.093 | na | 3.3 | 5.2 | 1.58 | 0.092 | na |

The results surprisingly show that in comparison with phosphepine matrix compound E1 having extended system of delocalized electrons, the new compound E2 affords high performance semiconducting materials despite its redox potential is 290 mV more negative in comparison with E1. This feature affords new degrees of freedom for design of organic semiconducting materials and electronic devices comprising such semiconducting materials.

EXAMPLES

General Remarks for Synthesis:

All reactions with moisture- and/or air-sensitive agents were carried out under argon atmosphere using oven dried glassware. Starting materials were used as purchased without further purification. Materials, which were used to build OLEDs, were sublimed by gradient sublimation to achieve highest purity.

Auxiliary Procedures

Cyclic Voltammetry

The redox potentials given at particular compounds were measured in an argon-deaerated, dry 0.1M THF solution of the tested substance, under argon atmosphere, with 0.1M tetrabutylammonium hexafluorophosphate supporting electrolyte, between platinum working electrodes and with an Ag/AgCl pseudo-standard electrode, consisting of a silver wire covered by silver chloride and immersed directly in the measured solution, with the scan rate 100 mV/s. The first run was done in the broadest range of the potential set on the working electrodes, and the range was then adjusted within subsequent runs appropriately. The final three runs were done with the addition of ferrocene (in 0.1M concentration) as the standard.

The average of potentials corresponding to cathodic and anodic peak of the studied compound, after subtraction of the average of cathodic and anodic potentials observed for the standard Fc+/Fc redox couple, afforded finally the reported value.

Analytics:

Melting points (mp) were determined by differential scanning calorimetry (DSC). Onset temperatures are reported.

11-Phenylbenzo[b]dinaphtho[2,1-d:1',2'-f]phosphepine-11-oxide (E1)

The comparative compound E1 was prepared by the procedure described in WO2015/097225.

9-Phenyltribenzo[b,d,f]phosphepine-9-oxide (E2)

The inventive compound E2 was prepared by the procedure according to following Scheme 1

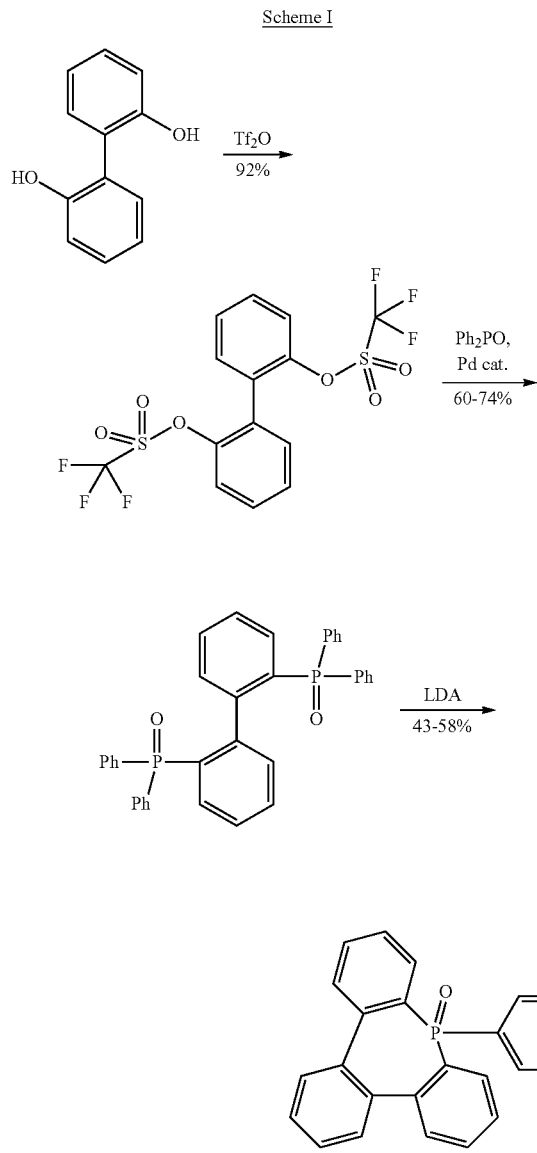

wherein the last rearrangement step with the intermediate C1

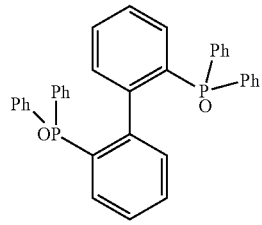

was analogous to the procedure used for E1 preparation.
mp 252° C.
CV redox potential vs Fc+/Fc −2.91 V (reversible)
Dopants:

lithium tetra-(1H-pyrazol-1-yl)borate (D1)

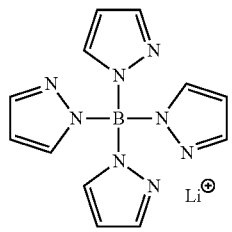

Prepared according to patent application WO2013/079676 (compound (7), p. 16-17)

Device Examples

The effect of the new compound E2 was tested in model OLEDs. All layers were deposited by vacuum thermal evaporation.

Inventive and comparative Example 1 (use as a matrix in an EIL doped with metal or metal salt) Bottom emission blue emitting OLED was made by depositing a 10 nm layer of HTM1 doped with PD2 (matrix to dopant weight ratio of 92:8 wt. %) onto a 90 nm thick ITO-glass substrate (ITO serves as an anode), followed by an 120 nm undoped layer of HTM1. Subsequently, a blue fluorescent emitting layer of ABH113 (Sun Fine Chemicals) doped with NUBD370 (Sun Fine Chemicals) (97:3 wt %) was deposited with a thickness of 20 nm, followed by an undoped 34 nm electron transport layer made of neat ABH113. On top of the ETL, a 4 nm thick EIL consisting of matrix compound E1 or E2 doped with 50 wt. % Yb or D1 was deposited. Finally, a layer of aluminium with a thickness of 100 nm was deposited as a cathode.

The observed voltages and quantum efficiencies at the current density 10 mA/cm² are reported in Table 1.

The features disclosed in the foregoing description, in the claims and in the accompanying drawings may both separately and in any combination be material for realizing the invention in diverse forms thereof.

Used Acronyms and Abbreviations
CV cyclic voltammetry
CGL charge generating layer
DCM dichloromethane
DSC differential scanning calorimetry
DFT density functional theory
DME 1,2-dimethoxyethane
EE ethylester (ethyl acetate)

ETL electron transporting layer
EQE external quantum efficiency of electroluminescence
Fc$^+$/Fc ferrocenium/ferrocene reference system
HPLC high performance liquid chromatography
HOMO highest occupied molecular orbital
HTL hole transporting layer
LUMO lowest unoccupied molecular orbital
LDA lithium diisopropyl amide
NMR nuclear magnetic resonance
SPS solvent purification system
TGA thermogravimetry thermal analysis
THF tetrahydrofuran
TLC thin layer chromatography
UV UV/Vis spectroscopy
eq chemical equivalent
mol. % molar percent
wt. % weight (mass) percent
mp melting point
n.a. not applicable
OLED organic light emitting diode
ITO indium tin oxide

The invention claimed is:

1. A compound having formula (II)

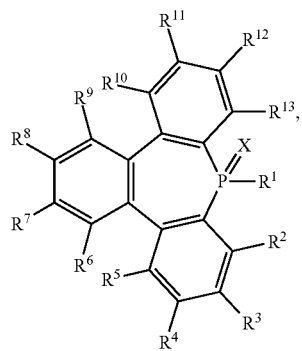

(II)

wherein
a) $R^1$ is selected from the group consisting of
   (i) unsubstituted phenyl and phenyl substituted with up to five substituents independently selected from the group consisting of alkyl, heteroalkyl, alkoxy, alkylthio, phenoxy, phenylthio, diphenylphosphinyl, diphenylphosphoryl and disubstituted amino group, wherein the substituents on the nitrogen atom of the amino group are independently selected from the group consisting of phenyl and alkyl,
   (ii) H, alkyl, heteroalkyl, alkoxy, alkylthio, phenoxy, phenylthio, diphenylphosphinyl, diphenylphosphoryl and disubstituted amino group, wherein the substituents on the nitrogen atom of the amino group are independently selected from the group consisting of phenyl and alkyl, and
   (iii) five-membered ring heteroaryl selected from the group consisting of thienyl, furyl, pyrrolyl, diazolyl, triazolyl, oxazolyl, thiazolyl, oxadiazolyl and thiadiazolyl, wherein the heteroaryl may be unsubstituted or substituted with one or more substituents independently selected from the group consisting of alkyl, heteroalkyl, alkoxy, alkylthio, phenoxy, phenylthio, diphenylphosphinyl, and disubstituted amino group, wherein the substituents on the nitrogen atom of the amino group are independently selected from the group consisting of phenyl and alkyl,
b) $R^2$-$R^{13}$ are independently selected from the group consisting of H, alkyl, heteroalkyl, alkoxy, alkylthio, phenoxy, phenylthio, diphenylphosphinyl, diphenylphosphoryl and disubstituted amino group, wherein the substituents on the nitrogen atom of the amino group are independently selected from the group consisting of phenyl and alkyl, and
c) X is selected from the group consisting of O and S.

2. The compound according to claim 1, wherein $R^1$ is phenyl and/or any of $R^2$-$R^{13}$ is H.

3. A semiconducting material comprising at least one compound according to claim 1.

4. The semiconducting material according to claim 3 further comprising at least one dopant.

5. The semiconducting material according to claim 4, wherein the dopant is an electrical dopant.

6. The semiconducting material according to claim 5, wherein the electrical dopant is a n-dopant.

7. The semiconducting material according to claim 6, wherein the n-dopant is selected from a metal, a metal salt or a metal complex.

8. An electronic device comprising the semiconducting material according to claim 3.

9. The electronic device according to claim 8, wherein the semiconducting material forms at least one layer arranged between an anode and a cathode.

10. The electronic device according to claim 9, wherein the layer comprising the semiconducting material is an electron transporting layer, an electron injecting layer, a charge generating layer, or fulfils both electron transporting and hole blocking function.

11. The electronic device according to claim 8, which is a light emitting device.

12. The electronic device according to claim 11, which is an organic light emitting diode.

13. The electronic device according to claim 8, wherein the semiconducting material is arranged between two electrodes.

* * * * *